(12) United States Patent
DiBattista et al.

(10) Patent No.: US 6,549,026 B1
(45) Date of Patent: **\*Apr. 15, 2003**

(54) APPARATUS AND METHOD FOR TEMPERATURE CONTROL OF IC DEVICE DURING TEST

(75) Inventors: Larry DiBattista, Morgan Hill, CA (US); Mark Malinoski, Dublin, OH (US); Tomoya Shitara, Hayward, CA (US)

(73) Assignee: Delta Design, Inc., Poway, CA (US)

( \* ) Notice: Subject to any disclaimer, the term of this patent is extended or adjusted under 35 U.S.C. 154(b) by 174 days.

This patent is subject to a terminal disclaimer.

(21) Appl. No.: 09/616,895

(22) Filed: Jul. 14, 2000

Related U.S. Application Data

(60) Continuation-in-part of application No. 09/993,066, filed on Nov. 27, 2001, which is a division of application No. 09/352,762, filed on Jul. 14, 1999, now Pat. No. 6,389,225.
(60) Provisional application No. 60/092,715, filed on Jul. 14, 1998, and provisional application No. 60/143,932, filed on Jul. 15, 1999.

(51) Int. Cl.[7] .............................................. G01R 31/02
(52) U.S. Cl. ...................................... 324/760; 324/224
(58) Field of Search ................................ 324/760, 765, 324/158.1, 73.1, 431, 224, 670, 685, 721, 441, 703; 392/479; 257/467; 219/494; 165/80.3, 80.2; 209/238

(56) References Cited

U.S. PATENT DOCUMENTS

| | | | |
|---|---|---|---|
| 4,734,872 A | 3/1988 | Eager et al. ................. | 364/557 |
| 4,870,355 A | 9/1989 | Kufis et al. | |
| 5,084,671 A | 1/1992 | Miyata et al. | |
| 5,172,049 A | 12/1992 | Kiyokawa et al. ....... | 324/158 F |
| 5,205,132 A | 4/1993 | Fu ............................... | 62/208 |
| 5,210,485 A | 5/1993 | Kreiger et al. | |
| 5,297,621 A | 3/1994 | Taraci et al. ............ | 165/104.13 |
| 5,309,090 A | 5/1994 | Lipp ...................... | 324/158 R |
| 5,315,240 A | 5/1994 | Jones ...................... | 324/158 F |
| 5,414,370 A | \* 5/1995 | Hashinaga .................. | 324/760 |
| 5,420,521 A | 5/1995 | Jones .......................... | 324/760 |
| 5,569,950 A | \* 10/1996 | Lewis ......................... | 257/467 |
| 5,821,505 A | \* 10/1998 | Tustaniwskyj .............. | 219/494 |
| 5,911,897 A | 6/1999 | Hamilton | |
| 6,389,225 B1 | \* 5/2002 | Malinoski ................... | 392/479 |

FOREIGN PATENT DOCUMENTS

| | | |
|---|---|---|
| DE | 19700839 | 7/1998 |
| EP | 631149 | 12/1994 |

\* cited by examiner

*Primary Examiner*—Kamand Cuneo
*Assistant Examiner*—Trung Nguyen
(74) *Attorney, Agent, or Firm*—Foley & Lardner

(57) ABSTRACT

An apparatus for controlling the temperature, during testing, of IC devices formed on a wafer includes a chuck for locating the devices during testing and multiple temperature control devices arranged on the chuck to correspond with the arrangement of the devices being tested on the wafer. The chuck itself can be cooled or heated, such as by the flow of a temperature-controlled fluid, and a temperature control device such as a heating element can be associated with each IC device being tested. Alternatively, a separate heat sink can be associated with each temperature control device and its corresponding IC device.

40 Claims, 11 Drawing Sheets

APPARATUS AND METHOD FOR TEMPERATURE CONTROL OF IC DEVICE DURING TEST

CROSS-REFERENCE TO RELATED APPLICATION

This application is a continuation-in-part of U.S. application Ser. No. 09/993,066, filed on Nov. 27, 2001, still pending, which is a divisional of U.S. application Ser. No. 09/352,762, filed on Jul. 14, 1999, now U.S. Pat. No. 6,389,225, which claims the benefit of U.S. Provisional Application No. 60/092,715, filed on Jul. 14, 1998. This application also claims the priority of previously filed provisional application No. 60/143,932, filed on Jul. 15, 1999, which is hereby fully incorporated as if fully set forth herein.

FIELD OF THE INVENTION

The present invention relates to the temperature control of integrated circuit ("IC") devices during testing. In particular, the invention relates to apparatus and methods for controlling the temperature of such devices when tested at wafer level.

BACKGROUND OF THE INVENTION

Functional testing of IC devices is necessary to verify performance prior to shipping to an end user. It is desirable to test such devices as early as possible in the manufacturing process so that any non-functioning devices can be removed from the process before further expensive processing steps are applied. The earliest stage in manufacturing at which full functionality of the devices can be tested is at the end of the processing of the wafer on which the devices are formed. Testing at this stage, often known as "wafer probing," has been used in previous testing strategies. Wafer prober interfaces are used as an interface with a test system. In a wafer prober interface, temporary contacts such as needles are placed into electrical contact with pads formed on the device, such as for power and input/output signals. The pads are formed while the device is still part of the wafer, that is, before the wafer is cut into individual or "singulated" devices. A test pattern is then applied via these pads.

Thermal control of devices during testing has been recognized as an issue in testing of IC devices. One particular problem with testing IC devices is that they are tested before temperature control devices such as heat sinks and fans are attached. For devices in which the power dissipation of the chip is relatively constant or only varies in a small range, temperature control can be achieved by placing the device in contact with a large thermal mass, which is held at the desired temperature. This method is generally unsatisfactory, however, if the value of the power dissipation of the device varies over a wide range.

One approach to controlling the temperature of a device under test comprises placing the device in contact with a temperature forcing system. The temperature forcing system is used to vary the degree of cooling or heating in order to maintain the device at the desired temperature set point during the test. Control of such systems typically uses a feedback loop based on the output of a temperature sensor, which is in contact with the device or, in certain cases, built into the device itself.

Typical temperature forcing systems often use forced air convection systems that extend well beyond the desired forcing temperature range at both the hot and cold ends. In this way, an attempt can be made to accelerate the device's temperature conditioning by overcooling or overheating. As the nominal power density of the devices continues to increase, the ability of forced air convection systems to overcool reaches practical limits, causing increases in the temperature error between the desired and actual temperatures. Another problem is the increased sensitivity that devices fabricated in the latest processes have to high temperatures. The potential for chip damage due to overheating adds risk to the use of the overheating approach. The combination of the limited ability to overcool and the need to be more conservative by not overheating results in an increased time to reach set point, with lost utilization of expensive test equipment and engineering personnel as the expense.

Another approach to the design of temperature forcing systems involves the use of dual liquid conduction systems, with one hot liquid and one cold liquid. The proportion of the liquids is mechanically metered to effect the desired forcing temperature. To achieve fast response times, this approach requires that the metering occur very close to the device. This imposes mechanical packaging constraints, which limit flexibility in bringing the surface of the temperature forcing system control surface into contact with the device or the device package. Even without these constraints, the mechanical metering of the dual liquids is slow in changing the forcing temperature when compared to the temperature changes induced by the device's instantaneous power dissipation. This relatively slow change also causes increased error between the desired and actual temperatures.

Examples of the systems described above can be found in the following U.S. Pat. Nos. 5,420,521; 5,297,621; 5,315,240; 5,205,132; 5,309,090; 5,821,505; 5,172,049; and 4,734,872. Some systems only heat the chip and do not provide a means for removing heat from the chip. Other systems increase or lower the chip temperature with a gas jet or with an immersing liquid. In these latter systems, the temperature accuracy for the chip is limited by the speed at which the temperature of the gas jet or liquid can be increased or decreased.

To date, the approach used in wafer probing for temperature control is to provide a thermal mass in the form of a heated and/or cooled chuck on which the wafer is placed during testing. The chuck attempts to maintain the temperature of the whole wafer at a desired set point during testing. An example of such a system is the ThermoChuck available from Temptronic Corp. of Newton, Mass. However, it is not possible for such a system to respond to localized temperature changes arising from an individual high performance device on a wafer being tested at speed. This limitation has effectively prevented wafer probing from being used to test high performance devices at speed early in the manufacturing process.

A need has arisen for a temperature control system which overcomes or at least reduces some of the problems encountered in controlling the temperature of devices when using wafer probing for testing.

SUMMARY OF THE INVENTION

Briefly, according to one aspect of the invention, there is provided an apparatus for control of integrated circuit devices under test. The apparatus includes a heat exchanger having a surface disposed to contact each of the plurality of integrated circuit devices. The surface has a plurality of regions corresponding to respective ones of the plurality of integrated circuit devices. During testing, the temperature of each of the plurality of integrated circuit devices is individually controlled at each of the plurality of regions.

Consistent with this aspect of the invention, the heat exchanger may comprise a chuck having a plurality of heating elements disposed at each of the regions, and the chuck may include a heat sink wherein each of the heating elements regulates the temperature of a corresponding one of the regions at a temperature above a temperature determined by the heat sink.

Also consistent with this aspect of the invention, the temperature of each region may be individually controlled by a heating element disposed on a heat sink or by a plurality of heating elements disposed over a corresponding one of a plurality of heat sinks.

Also consistent with this aspect of the invention, the plurality of integrated circuit devices may be formed on a wafer and the surface may be disposed to contact the wafer such that the plurality of regions correspond to respective ones of the plurality of integrated circuit devices formed on the wafer. Alternatively, the plurality of integrated circuit devices may be singulated devices, and the surface is disposed to contact the singulated devices such that the plurality of regions correspond to respective ones of the singulated devices.

Briefly, according to another aspect of the invention, there is provided a method of controlling the temperature of a plurality of integrated circuit devices during testing. The method includes placing the plurality of integrated circuit device in contact with a respective one of a plurality of regions of a surface of a heat exchanger. The temperature of each of the plurality of integrated circuit devices at each of the plurality of regions is controlled individually.

Consistent with this aspect of the invention, the heat exchanger may comprise a chuck having a plurality of heating elements disposed at each of the regions, and the chuck may include a heat sink wherein each of the heating elements regulates the temperature of a corresponding one of the regions at a temperature above a temperature determined by the heat sink.

Also consistent with this aspect of the invention, the temperature of each region may be individually controlled by a heating element disposed on a heat sink or by a plurality of heating elements disposed over a corresponding one of a plurality of heat sinks.

Also consistent with this aspect of the invention, the plurality of integrated circuit devices may be formed on a wafer and the surface may be disposed to contact the wafer such that the plurality of regions correspond to respective ones of the plurality of integrated circuit devices formed on the wafer. Alternatively, the plurality of integrated circuit devices may be singulated devices, and the surface may be disposed to contact the singulated devices such that the plurality of regions correspond to respective ones of the singulated devices.

Briefly, according to another aspect of the invention, an apparatus for controlling, during testing, the temperature of multiple integrated circuit devices formed on a wafer, comprises a chuck for locating the devices during testing. The apparatus further comprises multiple temperature control devices arranged in the chuck to correspond with the arrangement on the wafer of the devices being tested.

Consistent with this aspect of the invention, the chuck may be provided with means for controlling its temperature during the testing, and the means for controlling the chuck temperature may comprise a supply of temperature-controlled fluid or an electrical device.

Also consistent with this aspect of the invention, the multiple temperature control devices may comprise heating elements, and a heat exchanger body may be provided for each heating element or a single heat exchanger body may be provided for the multiple heating elements.

Briefly, according to yet another aspect of the invention, a method of controlling the temperature of multiple integrated circuit devices formed on a wafer during testing comprises locating the wafer on a chuck for testing, the chuck including multiple temperature control devices arranged to correspond with the arrangement on the wafer of the devices being tested. The individual devices on the wafer are tested, and the temperature of the individual devices being tested are controlled on the wafer using the corresponding temperature control device.

Consistent with this aspect of the invention, the method may further comprise singulating the devices formed on the wafer before testing, wherein the singulated devices are arranged on the chuck in the same arrangement as when they were formed on the wafer.

In another aspect of the invention, the temperature of each of a plurality of integrated circuit devices is individually controlled based on the power usage of the integrated circuit devices.

DETAILED DESCRIPTION OF THE PREFERRED EMBODIMENTS

Figure 1:
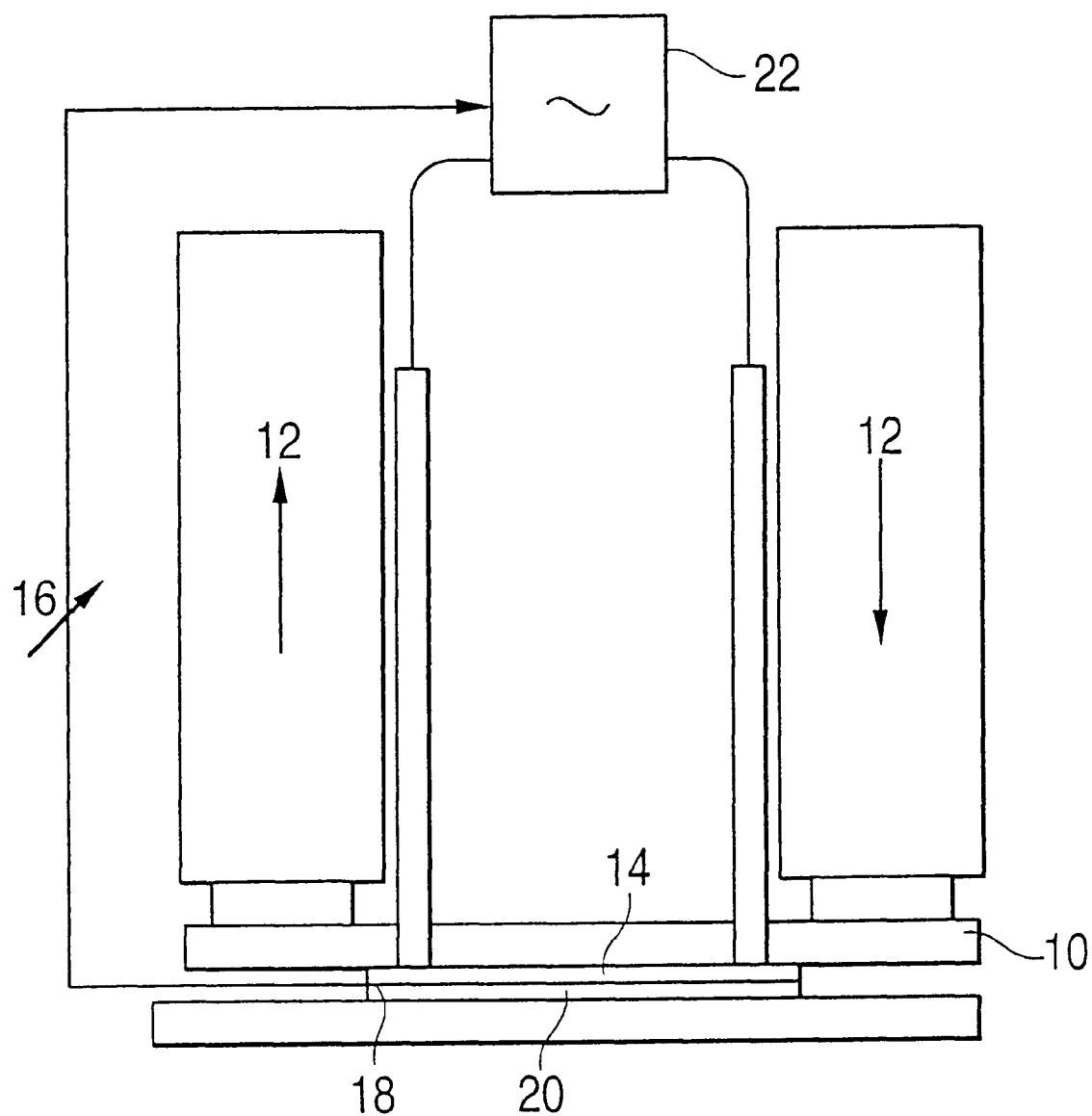
FIG. 1 shows a schematic side view of a heat exchanger.

FIG. 1 illustrates a heat exchanger that provides conductive thermal control of a device 20. The heat exchange includes a heat sink 10, which accommodates a circulating cooling liquid 12, a heating element 14, and a closed loop control 16 to hold a contact surface 18, of the test device and a device 20, at a set point temperature. The heat exchanger device also includes a power source 22 used by the closed loop control 16 in maintaining the contact surface 18 at the set point temperature.

In this example, the liquid 12 is preferably held at a constant temperature that is sufficiently below the set point temperature, which can be above or below the ambient temperature. The heating element 14 is then used to bring the temperature of the contact surface 18 to the desired set point temperature. In such a configuration, the liquid 12 cools the heating element 14 regardless of whether the set point temperature is above or below the ambient temperature.

The heat exchanger of FIG. 1 allows the contact surface temperature to be changed rapidly to compensate for variations in an IC device's instantaneous power dissipation. Also, the heating element 14 can be fairly compact, allowing more flexibility to accommodate typical device testing situations.

The temperature range for the liquid is typically −60° C. to +60° C. At any point in this temperature range, the viscosity of the liquid and the resulting flow rate are preferably consistent within some percentage to avoid negatively impacting the thermal control performance. One approach to achieve this combination of percentages which may be advantageously used with the apparatus according to the invention is described in commonly assigned U.S. Pat. application Ser. No. 09/352,762, entitled "APPARATUS, METHOD AND SYSTEM OF LIQUID-BASED, WIDE RANGE, FAST RESPONSE TEMPERATURE CONTROL OF ELECTRONIC DEVICES", filed on Jul. 14, 1999, the disclosure of which is hereby incorporated by reference.

Figure 2A:
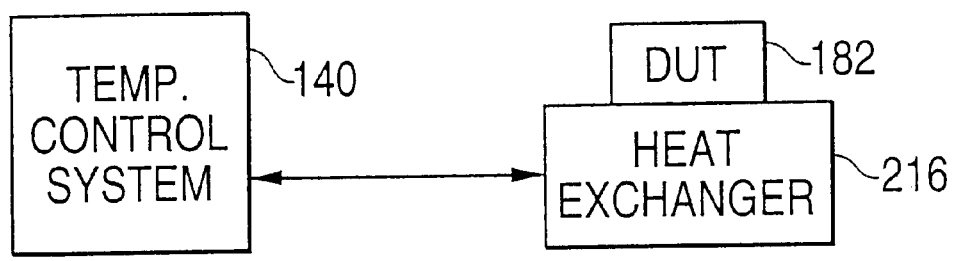
FIG. 2A is a high level block diagram showing the relationship between a heat exchanger, a device under test, and a thermal control system consistent with the present invention.

FIG. 2A is a simplified block diagram of a system such as that shown in FIG. 1. In FIG. 2A, a temperature control system 140 controls a heat exchanger 216 which is in thermal contact with a device under test ("DUT") 182. The DUT 182 is preferably in physical contact with a surface of the heat exchanger 216. In this diagram, a single DUT is shown. As explained below, however, the present invention allows for temperature control of the DUT 182 to a plurality of integrated circuit devices that may be tested at the same time.

Figure 2B:
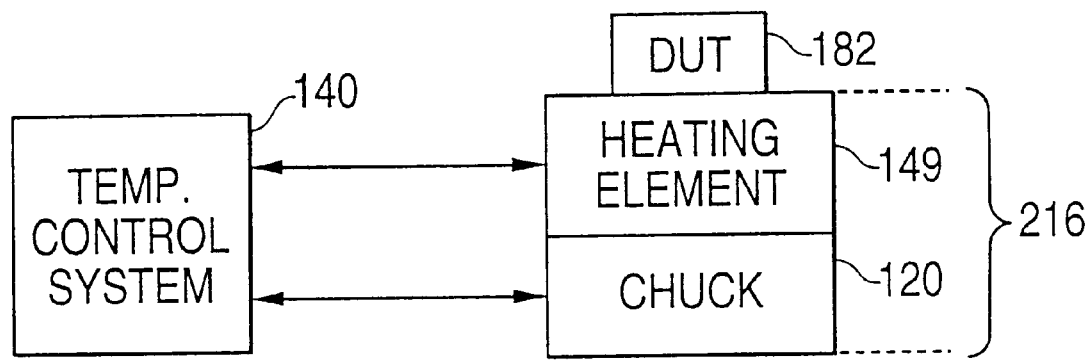
FIGS. 2B–2C show configurations of the heat exchanger of FIG. 2A.
Figure 2C:
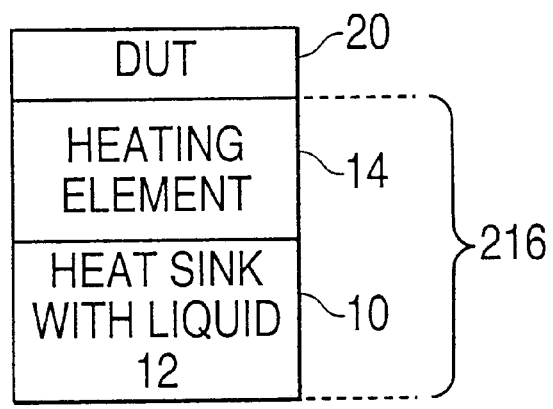

FIGS. 2B and 2C show examples of more specific implementations of the heat exchanger 216 and DUT 182 generally shown in FIG. 2A. In FIG. 2B, the heat exchanger 216 comprises a chuck 120 having a heating element 149 in thermal contact with the DUT 182. In FIG. 2C, the heat exchanger 216 comprises the heating element 14 and a heat sink 10 whose temperature is regulated with a liquid 12, such as in the manner described in reference to in FIG. 1.

Now that the more generalized aspect of a heat exchanger for thermal control of a DUT has been described, preferred embodiments of the invention are now discussed in which multiple DUTs undergoing wafer level testing are thermally controlled on an individual basis.

Figure 8A:
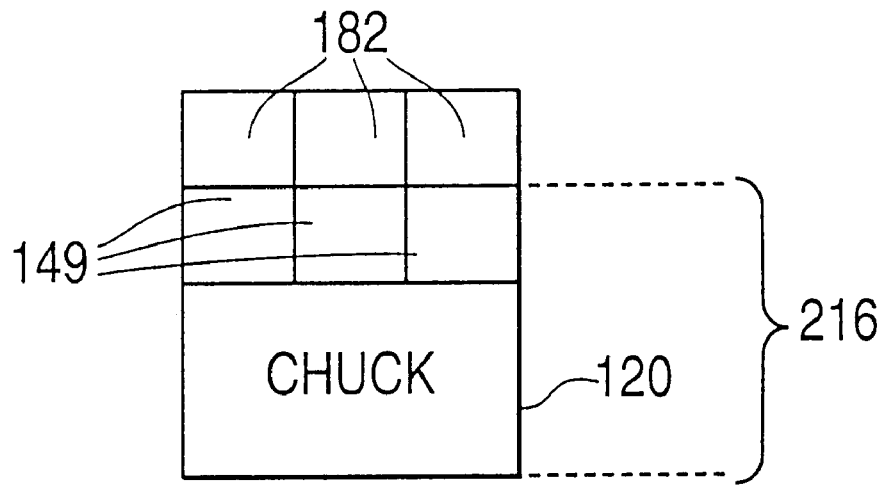
FIGS. 8A–8B depict embodiments of a heat exchanger with multiple heaters, thermally connected to individual devices consistent with the present invention.

As shown in FIG. 8A, a heat exchanger 216 according to the invention comprises a chuck 120 on which a plurality of heating elements 149 are incorporated. A plurality of DUTs 182 are located on the heating element 149, preferably in a one-to-one correspondence. This one-to-one correspondence between the heating elements 149 and the DUTs 182 provides the ability to control independently the temperature of each DUT 182 during a test.

Figure 8B:
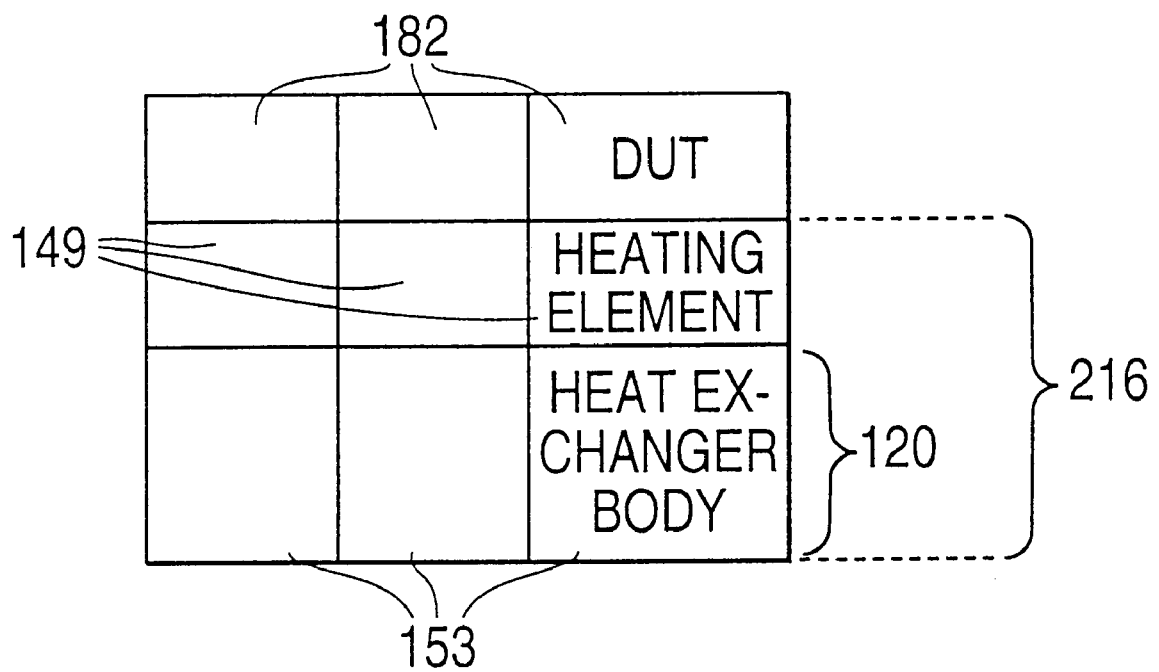

FIG. 8B shows an alternate embodiment in which separate heat exchanger bodies 153 are provided for each of a plurality of heaters 149. Each heat exchanger bodies 153 contain a cavity which allows a liquid to flow through them to act as a heat sink in the manner discussed above. The heat exchanger bodies 153 may be part of a single chuck 120.

Although FIG. 8B shows separate heat exchanger bodies 153 for each heating element 149, these bodies 153 may thermally impact each other depending on the level of thermal insulation between them. The same is true for the heating elements 149 themselves, irrespective of how many heat exchanger bodies 153 are present.

The individual heating elements 149, or heaters, may be implemented, for example, as a three layer co-fired aluminum nitride heater substrate with a heater trace between the first two layers and the RTD trace between the last two layers. The heater trace provides the heat energy and the RTD trace provides temperature information. The two traces are electrically isolated while being at essentially the same thermal position due to the thermal conductivity of the aluminum nitride layers. In a preferred embodiment, the heating elements 149 are resistive heaters. It is to be understood, however, that many other types of heating elements 149 may be used, including without limitation a heater utilizing lasers, other optics, or electromagnetic waves.

Figure 10A:
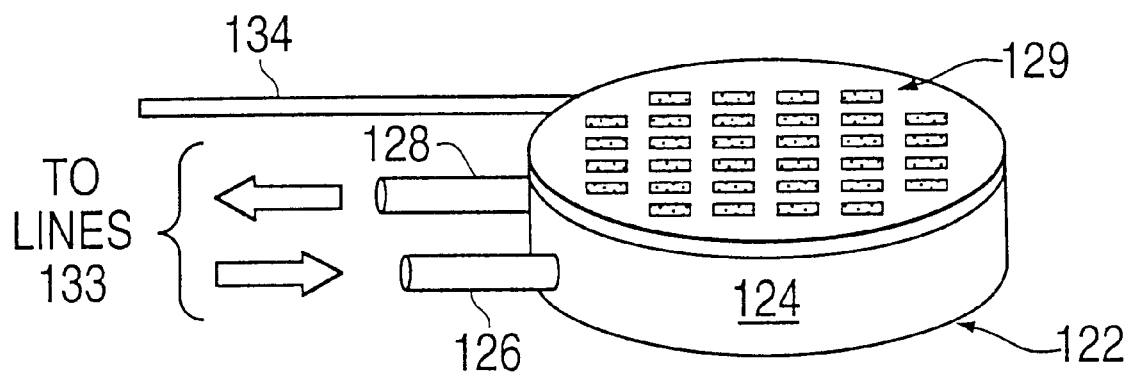
FIGS. 10A and 10B show perspective and top views, respectively, of a heat exchanger for use with wafers consistent with the present invention.
Figure 10B:
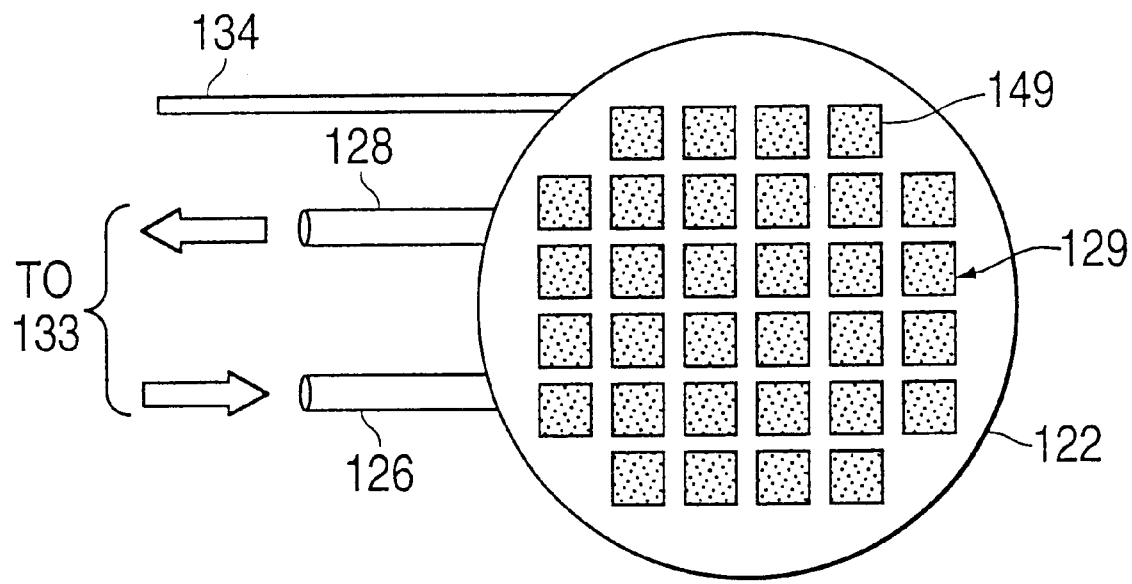

FIGS. 10A and 10B are respective perspective and top views of an exemplary heat exchanger in accordance with the invention. A chuck 122 serves to locate, that is, align, a whole wafer. Preferably, the chuck 122 is a fluid cooled, incorporating fluid cavity 124, a fluid inlet 126 and fluid outlet 128. The inlet 126 and the outlet 128 are connected through fluid supply lines 133 to the temperature control system such as that described above in reference to FIG. 1. Disposed on the upper surface of the fluid cooled chuck 122 is an array 129 of heating elements 149, which are connected to the temperature control system via a heater control cable 134. Each heating element 149 in the array 129 has a size and shape corresponding to that of the associated IC device to be tested on the wafer and the pattern of heating elements 149 matches that of the devices on the wafer. Consequently, when a wafer is positioned on the chuck 120, each device will be sitting on top of a heating element 149.

In this embodiment, each heating element 149 is controlled independently of the others. As a result, temperature control may be applied to the particular under test that is located on corresponding heating element 149 when a wafer is placed on the chuck 120 in such away that each DUT.

Figure 11A:
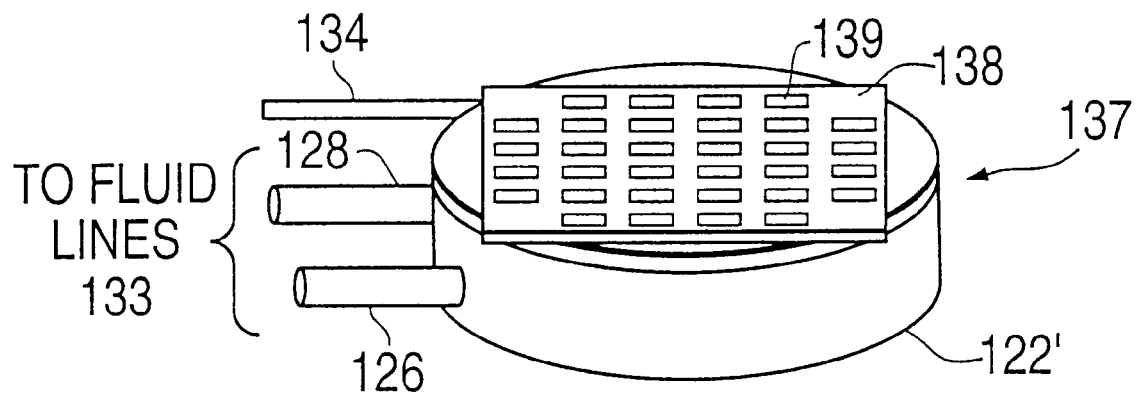
FIGS. 11A and 11B show perspective and top views, respectively, of a heat exchanger with a carrier arrangement for singulated devices consistent with the present invention.
Figure 11B:
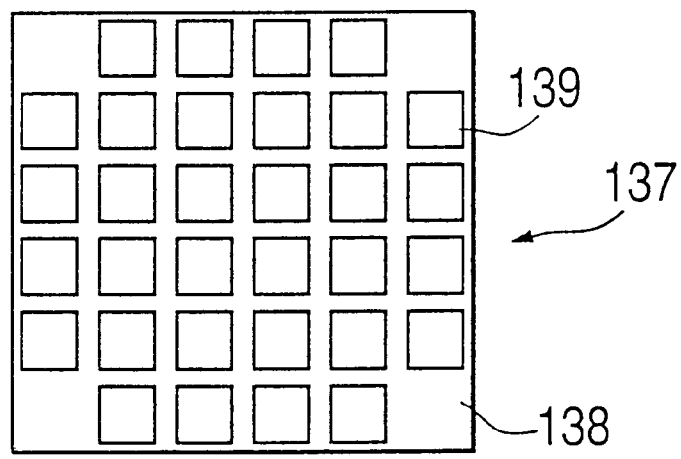

FIGS. 11A and 11B are respective perspective and top views of alternative and embodiment used to control singulated devices. "Singulating" refers to separating the devices, and singulated, devices are not necessarily in any particular arrangement although they may advantageously in correspondence with their respective locations on a pre-cut wafer. In this case, the chuck 122 and heating elements are essentially the same as in the embodiment for aligning a whole wafer, as shown in FIGS. 10A–10B. However, as shown in FIGS. 11A and 11B, a wafer size adapter 137 is placed over the chuck 122 and the heating element array. The wafer size adapter 137 comprises a carrier 138, having pockets 139 formed therein. The pockets correspond in shape, size, and position to the location of the IC devices in the wafer used for fabrication. Preferably, the carrier is formed of a low thermal resistance material.

The adapter 137 allows a wafer probe-type test to be performed on devices after the wafer has been cut to deliver the separate or "singulated" devices while still using the same chuck layout as would be used for a whole wafer. Thus, the positional relationship of the devices prior to separation from the wafer is retained and diagnosis of the production process is possible even though the wafer is no longer in one piece. Of course, it is not necessary to have a device in each pocket, especially if certain devices are already known to be faulty and not worth further processing or testing. Further, it is also not necessary to arrange the singulated devices on the adapter 137 in the same position that they had on the wafer. Nevertheless, arranging the singulated devices in the same position they had on the wafer provides additional testing information about the wafer. The singulated devices could also be tested individually if desired.

Each of the heating elements 149 may be incorporated into a common heat exchanger body as shown in FIGS. 10A and 10B, in which each of the heating elements 149 is in thermal contact with the fluid cavity 124 of the fluid cooled chuck 122. Other embodiments may utilize multiple, separated heat sinks. These multiple sinks may be in thermal contact with individual heating elements 149 or with multiple heating elements 149. It is noted that in a preferred embodiment, the chuck 120 does not contain the heating elements 149. However, the heating elements 149 may be integrated with the chuck 120.

Although a preferred embodiment includes a chuck which supports the heating elements, any device which can hold, retain, or secure a plurality of heating elements 149 may be used instead. This may be, for example, the adapter 137, a surface, an array of columns or other support structures, or any other suitable support device. If the heating elements 149 are secured or a retaining device is used to hold them, it is also possible to contact the DUTs 182 from the side or the top. In some embodiments, only the heating elements 149 are fixedly arranged so that DUTs 182 can be aligned with them. The heating elements 149 can be fixed in their arrangement through bonding, adhesion, retention, limited space for movement, or any other suitable mechanism or device. In such embodiments, a chuck per se is unnecessary if the temperature control can be performed by the heating elements 149.

Figure 3:
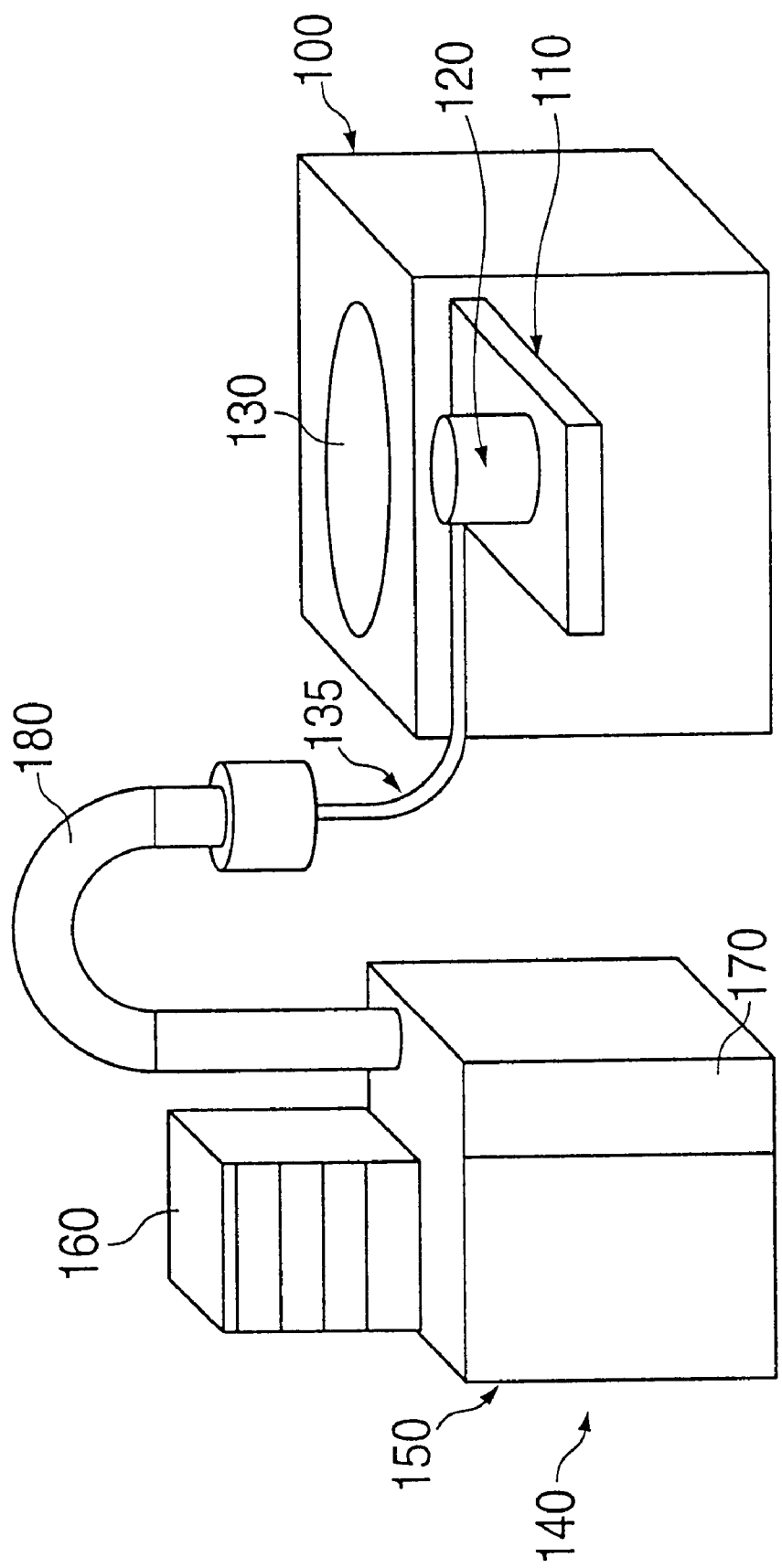
FIG. 3 shows a schematic system level perspective view of a testing apparatus consistent the present invention.

FIG. 3 illustrates an exemplary application of the invention in conjunction with a test device comprising a wafer prober 100. The wafer prober 100 may be one of several that are available, such as a UF200 prober obtainable from Tokyo Seimitsu Co., Ltd. (TSK). The wafer prober 100 includes a stage 110 carrying a chuck 120. The chuck 120 is arranged to carry a wafer (not shown) on which a number of semiconductor integrated circuit devices have been formed. Such wafers are typically 200 mm in diameter although other sizes are often used, and can have more than 200 devices formed on them. The number and arrangement of devices on the wafer will vary according to the particular design of the IC device in question.

The test device of FIG. 3 also comprises a test head interface 130 providing electrical connections, which may be applied to power and input/output pads on the devices on the wafer. The connections can be needles or any other form of contact appropriate to the device in question. The test head interface 130 is provided with connections for the test head of any of several available test systems, such as the ITS 9000 IX (not shown) of Schlumberger Technologies, Inc. of San Jose, Calif.

The test device of FIG. 3 further comprises a temperature control system 140. The chuck 120 is connected by way of fluid supply lines and control cables contained in a housing 135 to the temperature control system 140. The temperature control system 140 may be implemented by any of several available systems, such as an ETC 1000 manufactured by Schlumberger Technologies, Inc. The temperature control system 140 comprises a thermal control chassis 150 carrying a system controller 160 provided with an operator interface, a liquid cooling and recirculation system 170, and a boom arm 180 supporting the fluid supply lines and control cables.

Operation of the system shown in FIG. 3 is essentially the same as that described in Malinoski, et al., U.S. patent application Ser. No. 09/352,762, titled "APPARATUS, METHOD AND SYSTEM OF LIQUID-BASED, WIDE RANGE, FAST RESPONSE TEMPERATURE CONTROL OF ELECTRONIC DEVICES", filed on Jul. 14, 1999, and referred to above. Specifically, the system controls the temperature of a test device at or near a set point temperature despite potential fluctuations in the device temperature caused by self-heating.

Figure 4:
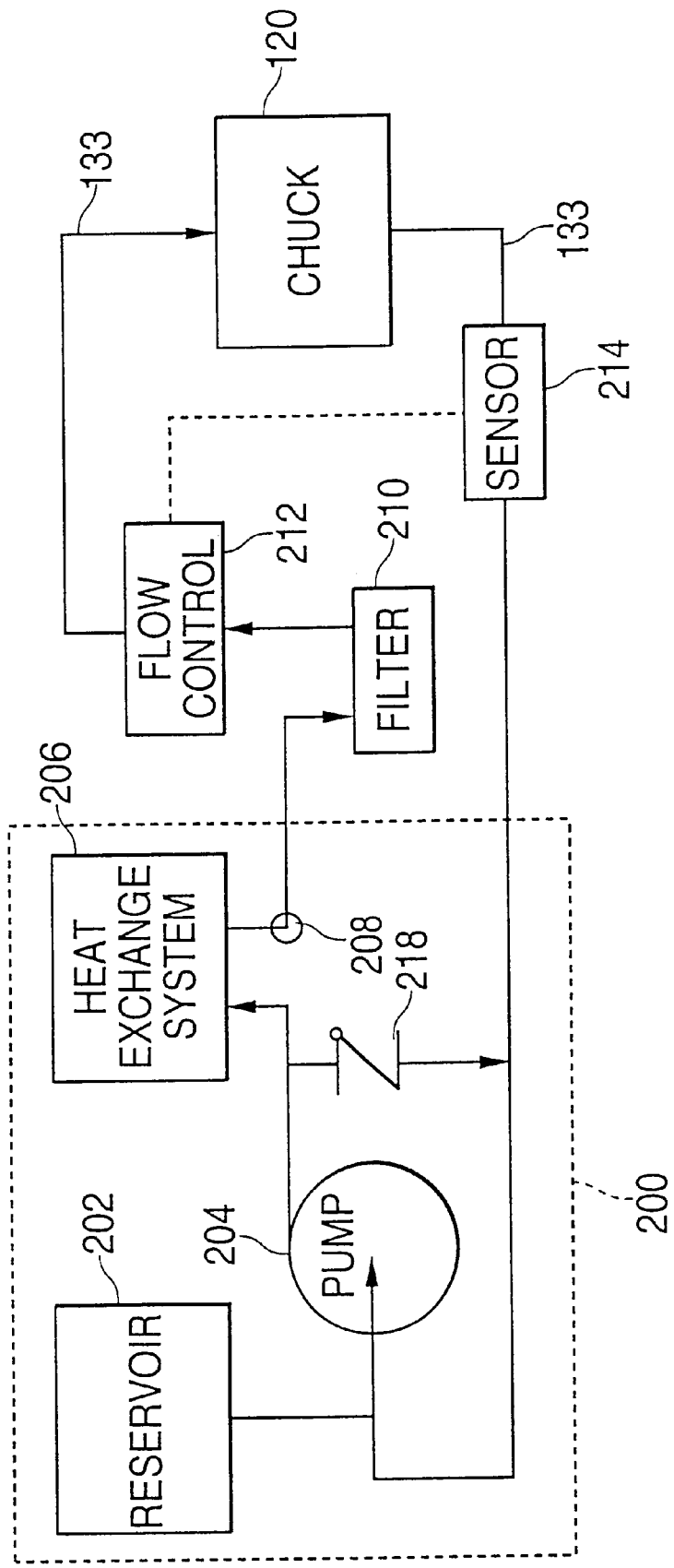
FIG. 4 shows a block diagram of the coolant system of FIG. 3.

FIG. 4 shows a block diagram of the liquid cooling and recirculating system 170. As shown in FIG. 4, the liquid cooling and recirculating system 170 includes a chiller system 200, a filter 210, and a flow control 212. The chiller system comprises a pressurized coolant reservoir 202, a pump 204, a heat exchange (heating/cooling) system 206, a temperature sensor 208, and a pressure relief valve 218. Fluid passes from the chiller system 200, via the temperature sensor 208, through the filter 210 to the flow control 212 and on to the chuck 120. Fluid then returns from the chuck 120 and through a flow sensor 214 to be pumped around the liquid cooling and recirculating system 170 again. In an alternative embodiment, the flow sensor 214 can be placed in the path of the fluid flowing into the chuck 120, such as between the flow control 212 and the chuck 120. The flow sensor may also be implemented as part of the liquid cooling and recirculating system 170 in an alternative embodiment. The pressure relief valve 218 is disposed between the pump output and pump input to avoid accidentally overpressurizing the system. The fluid flows into and out of the heat exchanger 216 through the fluid supply lines 133.

In one embodiment of the present invention, the heat exchanger 216 exchanges heat between the liquid cooling and recirculating system 170 and a DUT. In other embodiments, however, the heat exchanger 216 may include the liquid or the liquid cooling and recirculating system 170.

The cooling fluid may be, for example, HFE7100 operating between −40° C. and +40° C., water/glycol or water/methanol mixtures operating between +10° C. and +90° C., or any other suitable fluid depending on the desired temperature and heat dissipation required. HFE7100 is a specialty liquid manufactured by 3M corporation, which contains ethyl nonafluorobutylether and ethyl nonafluoroisobutylether. In operation, the difference between the device set point temperature and the fluid temperature can be in the range of 5° C. to 160° C., with device set point temperatures typically in the range of −35° C. to +170° C.

As shown in FIG. 4, liquid circulating through the chuck 120 is cooled below a set point temperature. The heating element 149 of FIG. 2B, which is in thermal contact with the chuck 120 and a DUT 182, is used to maintain the temperature of the DUT 182 at the set point temperature. In such an embodiment, the chuck 120 acts as a heat sink by absorbing heat energy from the heating element 149 and, at times, indirectly, from the test device 182.

Figure 5:
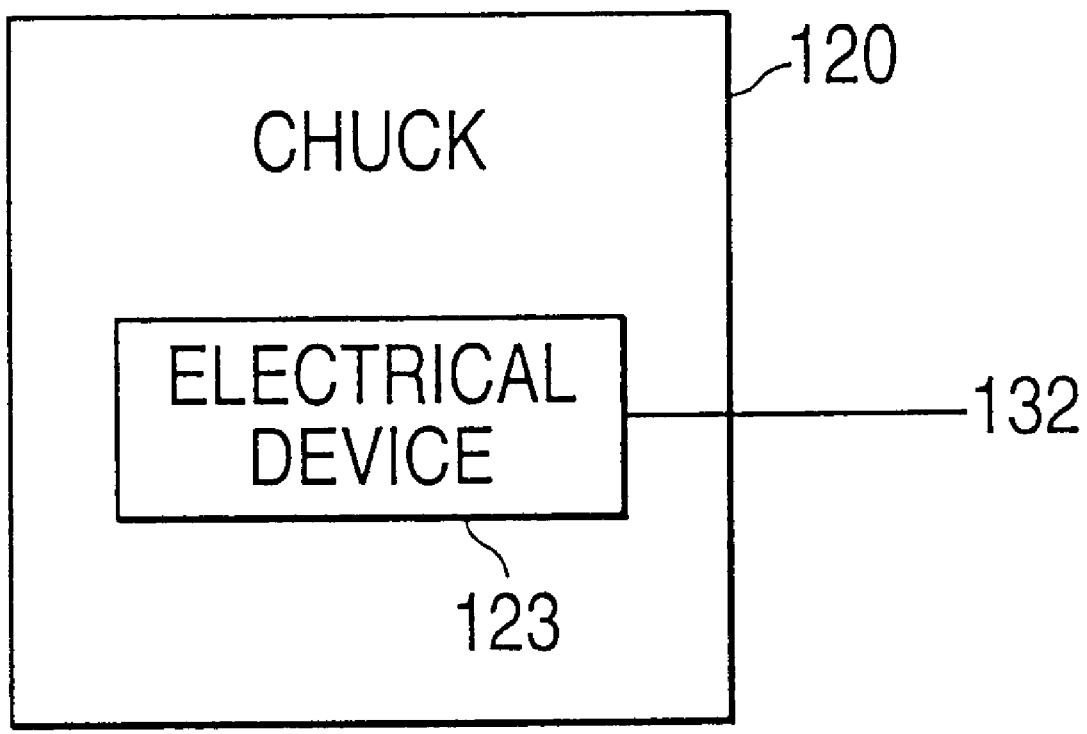
FIG. 5 depicts an example of a chuck consistent with the present invention.

It will be appreciated that other systems besides the liquid cooling and recirculating system may be used to vary the temperature of the chuck. For example, forced air systems, electric heaters, Peltier devices, highly conductive construction materials for the chuck 120, and ambient air with a large temperature differential would each allow the chuck 120 to act as a device for exchanging heat. One of these examples is shown in FIG. 5, where an electrical device 123 is contained within the chuck 120 and is controlled by control lines 132.

Figure 6:
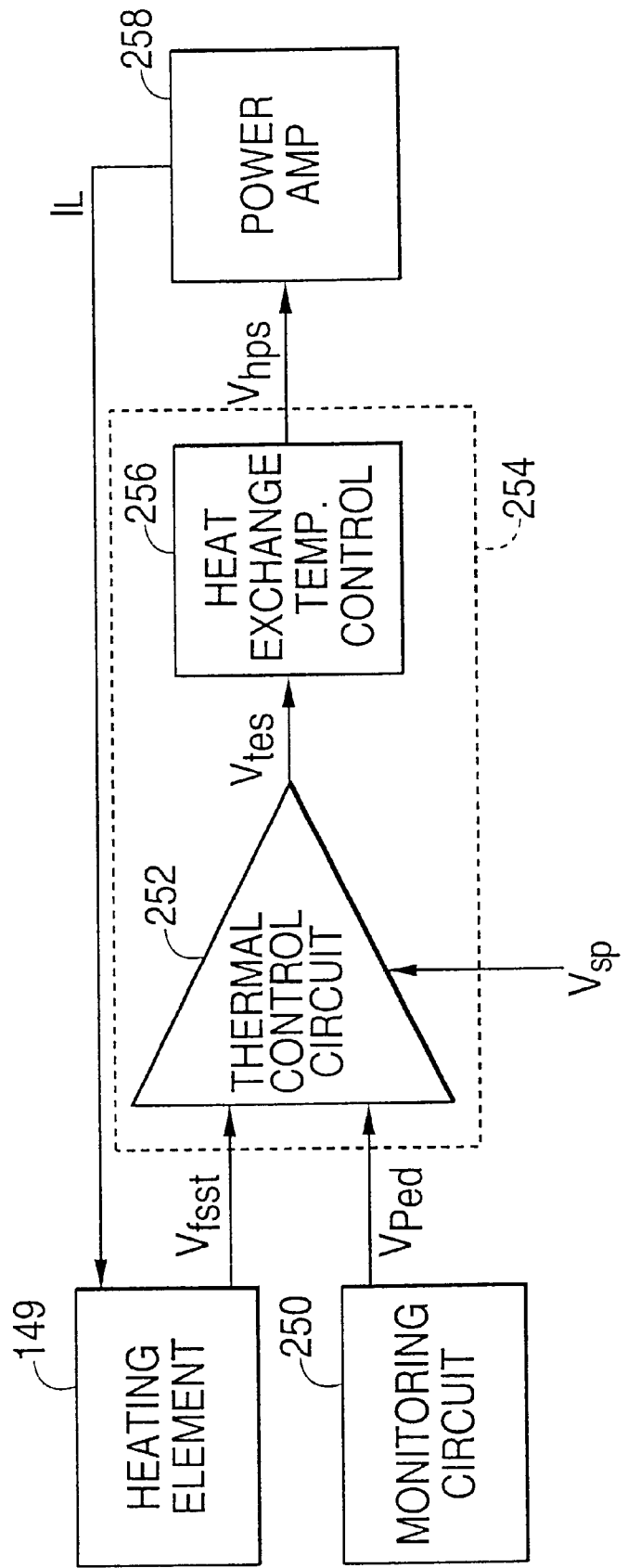
FIG. 6 shows a high level block diagram of the control electronics for the system controller of FIG. 3.

FIG. 6 shows a high level block diagram of the control electronics of the system controller 160 of the temperature control system 140 shown in FIG. 3. Variables in the control electronics system include (i) a signal $V_{fsst}$, representing a system forcing temperature $T_{fss}$ of the heating element 149, measured by a temperature sensor in a heating element (not shown), (ii) a signal $V_{Ped}$ representing a device power consumption, $P_{ed}$, measured by a monitoring circuit 250, which calculates the heat generated by the device (not shown) from the power drawn by the device during the test, and (iii) a signal $V_{sp}$ representing a device set-point temperature $T_{sp}$, which is set by the user. These variables are provided as inputs to a thermal control circuit 252 forming part of a thermal control board 254 in the system controller 160.

The thermal control circuit 252 generates a temperature control signal $V_{tcs}$ in a manner described below with respect to FIG. 9 and provides this signal to a heat exchanger temperature control 256 on the board 254. The heat exchanger temperature control 256 outputs a heater power signal $V_{hps}$ to a power amplifier 258, which provides a heater power $I_h$ to the heating element 149.

Figure 7:
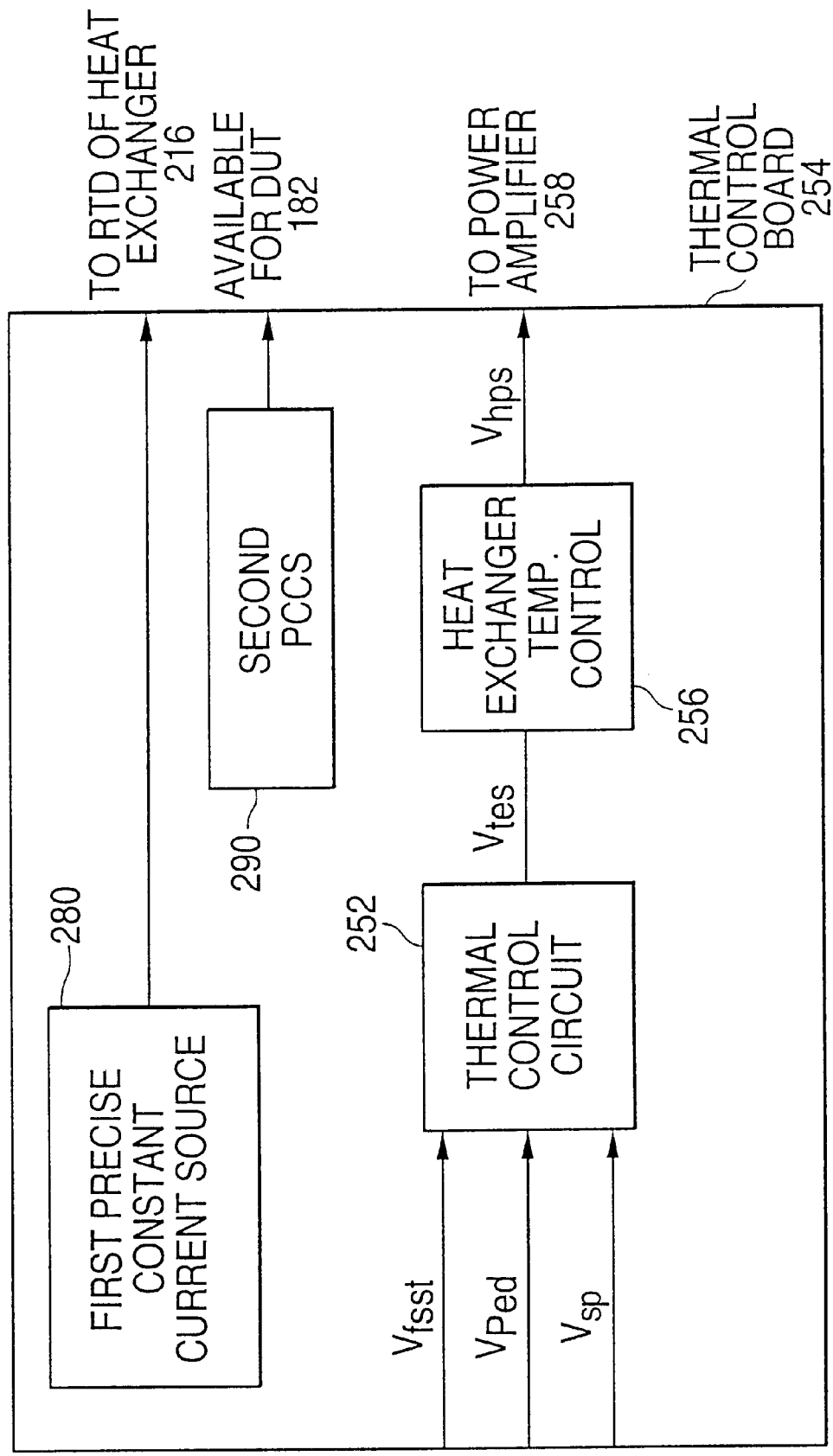
FIG. 7 shows a partial block diagram of the thermal control board of FIG. 6.

FIG. 7 shows a more detailed block diagram of the thermal control board 254. As shown in FIG. 7, the thermal control board 254 comprises, in addition to the thermal control circuit 252 and the heat exchanger temperature control 256, a first precise constant current source 280 and a second precise constant current source 290. The first precise constant current source 280 sends a precise constant current from the thermal control board 254 to a variable resistance device ("RTD") in the heating element 149. The RTD responds to the system forcing temperature and outputs a voltage representing the system forcing temperature $V_{fsst}$. The system forcing temperature signal feeds back into the thermal control circuit 252. Separating the first precise constant current source 280 from the heater 149 allows in that the heater 149 to be replaced more easily. The second precise constant current source 290 is available to send a precise constant current to the DUT.

Although only one thermal control board 254 is shown in FIG. 6, multiple boards can be provided. The use of multiple boards would allow simultaneous operation of a plurality of heating elements 149, each of which could be contained in the heat exchanger 216 and be thermally coupled to individual DUTs 182, as shown in FIG. 8A. Each separate board 254 would preferably have a separate set of inputs ($V_{fsst}$, $V_{Ped}$, $V_{sp}$) and the various values of $V_{fsst}$ would come from the plurality heating elements 149. Separate monitoring circuits 250 could be used to monitor the power of the individual DUTs 182, and separate power amplifiers 258 could be used for each heating element 149. It may be possible, however, for the separate power amplifiers 258 to be housed in a single device.

Figure 9:
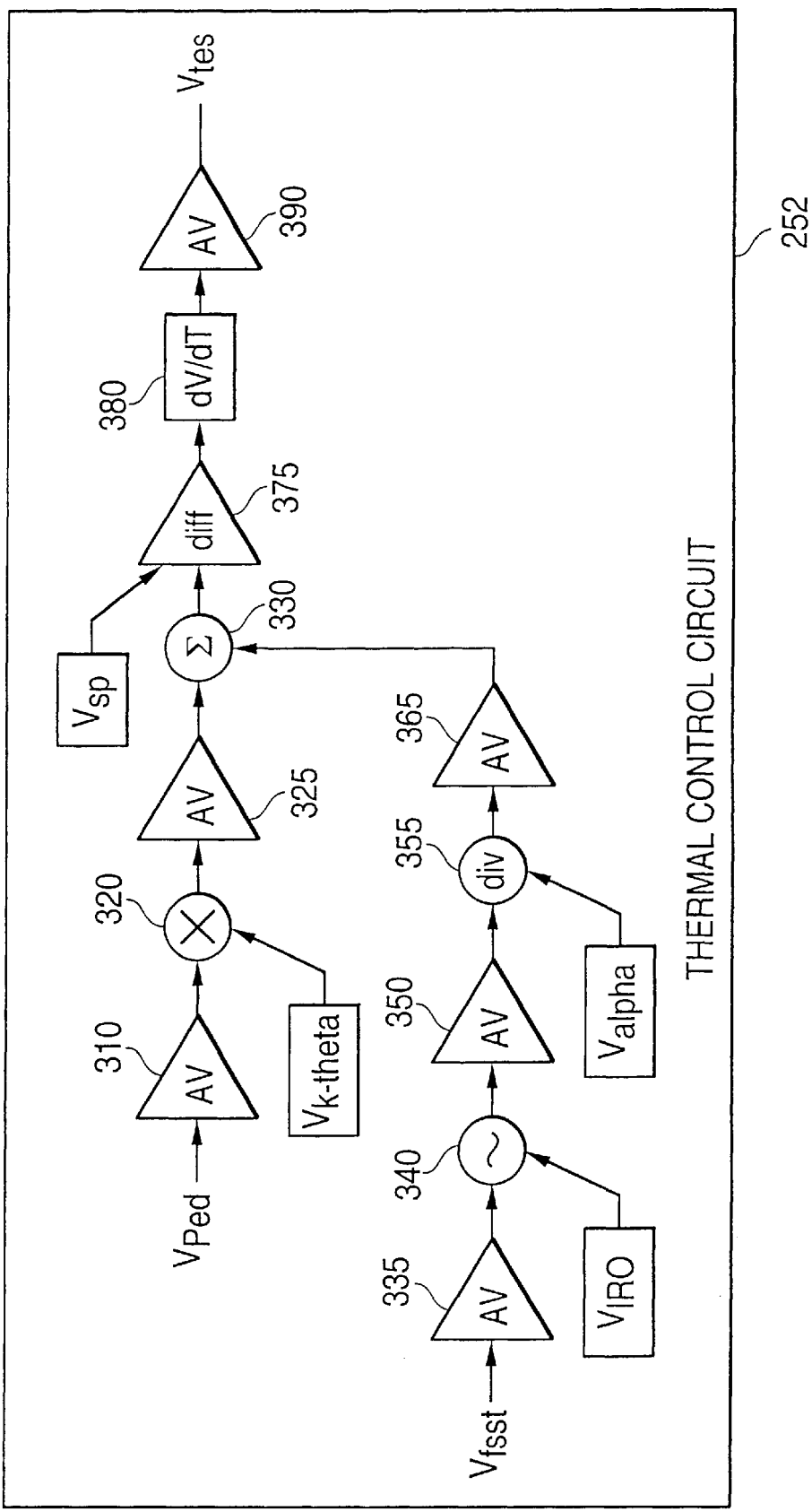
FIG. 9 shows a schematic diagram of the thermal control circuit of FIG. 3.

FIG. 9 shows a more detailed block diagram of the thermal control circuit 252. Such thermal control circuit is described in more detail in commonly assigned U.S. patent application Ser. No. 09/352,760 to Jones, et al., titled "TEMPERATURE CONTROL OF ELECTRONIC DEVICES USING POWER FOLLOWING FEEDBACK," the disclosure of which is hereby fully incorporated as if fully set forth herein. That application discloses, among other things, a power following feedback control method. The temperature of the device under test can be determined using the following equation:

$$\text{Device Temperature} = K_{theta} * P_{ed} + T_{fss}$$

Where:
Device Temperature (° C.) represents the device temperature derived from its power dissipation.

$K_{theta}$ is a constant (° C./watts) derived from the capabilities of the temperature control system and the thermal resistance of the medium (or media, in those cases where heat spreaders, lids, or other devices are attached to the top of the device itself) between the electronic device and the heat exchanger $P_{ed}$ (watts) is the total power usage of the DUT, represented by the signal $V_{Ped}$ which is obtained from the monitoring circuit 250 and which represents the power, in watts, consumed by the DUT.

$T_{fss}$ (° C.) is the system forcing temperature and is the absolute temperature of the medium contacting the device, as measured by a temperature sensor embedded in the thermal control system surface (preferably the surface of a heating element in the heat exchanger 216). $T_{fss}$ is represented by the signal $V_{fsst}$.

$K_{theta}$ is also derived from the general efficiency of the thermal control system when in contact with a DUT 182. For example, at set point temperatures well above ambient, the DUT 182 loses proportionally more heat to its surroundings, and the thermal control system must work harder to raise the DUT temperature than to lower it. From the standpoint of a thermal control system responding to DUT self-heating, the overall effect is the same as a lower thermal resistance between the DUT 182 and the heat exchanger 216 operating at an ambient set point. Similarly, at set point temperatures well below ambient, the DUT 182 gains heat from its surroundings, and the temperature control system 140 must work harder to lower temperature than to raise it. From the standpoint of the temperature control system responding to DUT self-heating, the overall effect is the same as a higher thermal resistance between the DUT 182 and the heat exchanger 216 operating at an ambient set point. In both cases, $K_{theta}$ is adjusted to reflect the effect of heat transfer to the DUT's surrounding environment during power excursions.

$K_{theta}$ may be considered an effective or a fine-tuned thermal resistance of the medium. Although the thermal resistance of different media are set out in standard chemistry reference books (such as CRC Handbook of Chemistry and Physics, 77$^{th}$ Edition; David R. Lide, Editor-in-Chief), factors such as ambient humidity, pressure, and temperature may affect the actual thermal resistance. Thermal resistance may also be affected by the physical configuration of the test. To determine $K_{theta}$, one can use a calibration process to adjust the value of the anticipated thermal resistance of the medium and ascertain whether the result is an improvement. Another advantage of a calibration process is that it will automatically account for the "efficiency factor" of the heat transfer from the DUT 182 to the temperature control system 140 as a function of the set point temperature.

As described above $K_{theta}$ may incorporate the effects of a variety of variables into one term. In the preferred embodiment, $K_{theta}$ may be optimized for a given application, or type of DUT 182, and then can be used to test many different devices of the same type. Additionally, one practical effect of $K_{theta}$ is that in mirroring the monitored power consumption of the device with the temperature of the test device, $K_{theta}$ magnifies or compresses the relative magnitude of the mirroring.

The temperature control signal is determined using the following equation:

$$V_{tcs}=d(V_{sp}-((V_{k\text{-}theta}*V_{Ped})+(V_{fsst}-V_{IRO}/V_{alpha})))/dt$$

Where:

$V_{tcs}$ is the temperature control signal.

$V_{sp}$ is a voltage representing the set-point temperature, $T_{sp}$, for the device.

$V_{k\text{-}theta}$ is a voltage representing the $K_{theta}$ value. The $K_{theta}$ value is input into a digital to analog converter which generates a voltage corresponding to the value of the input.

$V_{fss}$ is a voltage representing the forcing system surface temperature, $T_{fss}$, and generated by digital to analog conversion.

$V_{IRO}$ is a voltage representing a voltage equal to the value of the precise constant current from the first precise constant current source 280 in the thermal control board 254 multiplied by the resistance shown by the variable resistance device in the heat exchanger at 0 degrees C. and generated by digital to analog conversion. This voltage can be determined when the embedded temperature sensor in the heat exchanger is calibrated.

$V_{alpha}$ is a voltage representing the slope of a curve for the variable resistance device in the heat exchanger of resistance versus temperature and generated by digital to analog conversion. This voltage can be determined when the embedded temperature sensor in the heat exchanger is calibrated.

Returning to FIG. 9, the power usage signal $V_{Ped}$ from the monitoring circuit 250 shown in FIG. 6 enters the thermal control circuit 252 by passing through a first amplifier 310. From there, the power usage signal passes into a multiplying circuit 320 where it is multiplied with $V_{k\text{-}theta}$ to create a first modified signal. The modified power usage signal then passes into a second amplifier 325 and from there into a thermal summing circuit 330. The voltage $V_{fsst}$ representing the system forcing temperature enters the thermal control circuit 252 by passing through a third amplifier 335. From there, $V_{fsst}$ passes into a subtracting circuit 340 where $V_{IRO}$ is subtracted from $V_{fsst}$ for a calibrated $V_{fsst}$. The calibrated $V_{fsst}$ passes through a fourth amplifier 350 and into a divisional circuit 355 where the calibrated $V_{fsst}$ is divided by $V_{alpha}$. A result representing $(V_{fsst}-V_{IRO})/V_{alpha}$ passes through a fifth amplifier 365 and from there passes into the thermal summing circuit 330, and is summed there with the modified power usage signal to yield a summation. The summation passes into a differential circuit (or subtraction circuit) 375 which subtracts the summation from the set point temperature voltage, $V_{sp}$, to yield a resulting signal. The resulting signal passes into a derivative circuit 380 which takes the derivative of the resulting signal with respect to time. This yields the temperature control signal $V_{tcs}$ which is amplified by a sixth amplifier 390 before being output from the thermal control circuit 252.

Other methods of controlling the heat exchanger 216 may also be used. For example, commonly assigned U.S. patent application Ser. No. 08/734,212 (the disclosure of which is hereby fully incorporated by reference), describes, among other things, open loop control with power profiles. Other open loop methods, for example and without limitation, may monitor the temperature of the DUT 182 or of some other location in the test system. Still other methods may use feedback systems based on, for example and without limitation, the DUT temperature, the heat exchanger temperature, or the power drawn by the heat exchanger. Examples of temperature control devices include, without limitation, resistive heating elements and all substitutes mentioned therefore above, and liquid heat exchangers and all substitutes mentioned therefore above.

This disclosure has described a test device which, among other things, allows the benefit of a heat exchanger to be applied to a wafer prober for temperature control of devices during testing. The present system is capable of providing a variety of other functions. Some of these additional functions include test control, temperature determination, and data acquisition.

In addition, while the preferred implementation comprises a liquid cooled heat exchanger and an electric heating element, the exact method of providing cooling or heating can be chosen from any suitable source. For example, heated liquids or gases can be used as the heating element.

Also in a preferred implementation, a feedback loop is used to control the operation of the heating element while the liquid cooled heat exchanger is operated as a set point heat sink. Other methods of control, such as device power consumption monitoring or test power consumption profiling, can also be used.

The present invention also provides a method for testing IC devices at wafer level in which the temperature of each device on the wafer is controlled independently of the other devices on the wafer during a test. In addition, the test can be run at high speed without the danger of heat damage to the devices.

While the invention outlined above is discussed mainly in terms of wafer-level testing, it can also be applied to multiple singulated (that is, separated) devices. Preferably, these devices are arranged in a carrier in the same arrangement in which they were formed on the wafer. By retaining, during testing, the layout which the devices had on the wafer, production problems may be identified which depend on the position of a device on a wafer. This retention of the layout allows diagnosis of the production process and may improve yield.

The principles, preferred embodiments, and modes of operation of the present invention have been described in the foregoing specification. The invention is not to be construed as limited to the particular forms disclosed, because these are regarded as illustrative rather than restrictive. Moreover, variations and changes may be made by those of ordinary skill in the art without departing from the spirit of the invention.

What is claimed is:

1. An apparatus for control of integrated circuit devices under test, comprising:
   a heat exchanger having a surface disposed to contact each of the plurality of integrated circuit devices, said surface having a plurality of regions corresponding to respective ones of the plurality of integrated circuit devices,
   wherein the temperature of each of the plurality of integrated circuit devices is individually controlled at each of the plurality of regions during testing.

2. An apparatus according to claim 1, wherein the heat exchanger comprises a chuck having a plurality of heating elements disposed at each of said regions.

3. An apparatus according to claim 2, wherein the chuck includes a heat sink, each of said heating elements regulating the temperature of a corresponding one of said regions at a temperature above a temperature determined by the heat sink.

4. An apparatus according to claim 3, wherein the heat sink defines a cavity adapted to be provided with a flow of temperature-controlled fluid.

5. An apparatus according to claim 4, wherein the temperature of the fluid and the heating elements are regulated based on the power usage of said plurality of integrated circuit devices.

6. An apparatus according to claim 1, wherein one of a plurality of heater elements is provided at each of the plurality of regions.

7. An apparatus according to claim 1, wherein the temperature of each region is individually controlled by a heating element disposed on a heat sink.

8. An apparatus according to claim 7, wherein each of said heating elements is disposed over a corresponding one of a plurality of heat sinks.

9. An apparatus according to claim 7, wherein each of said heating elements is disposed over a single heat sink.

10. An apparatus according to claim 1, wherein the temperature of each of the plurality of integrated circuit devices is individually controlled based on the power usage of said integrated circuit devices.

11. An apparatus according to claim 1, wherein the plurality of integrated circuit device are formed on a wafer and the surface is disposed to contact the wafer such that the plurality of regions correspond to respective ones of the plurality of integrated circuit devices formed on the wafer.

12. An apparatus according to claim 1, wherein the plurality of integrated circuit devices are singulated devices, and the surface is disposed to contact the singulated devices such that the plurality of regions correspond to respective ones of the singulated devices.

13. Apparatus for controlling, during testing, the temperature of multiple integrated circuit devices formed on a wafer, the apparatus comprising:
   (i) a chuck for locating the devices during testing; and
   (ii) multiple temperature control devices arranged in the chuck to correspond with the arrangement on the wafer of the devices being tested.

14. Apparatus as claimed in claim 13, wherein the chuck is provided with means for controlling its temperature during the testing.

15. Apparatus as claimed in claim 14, wherein the means for controlling the chuck temperature includes a supply of temperature-controlled fluid.

16. Apparatus as claimed in claim 14, wherein the means for controlling the chuck temperature comprises an electrical heating device.

17. Apparatus as claimed in claim 13, wherein the multiple temperature control devices comprise heating elements.

18. Apparatus as claimed in claim 17, further comprising at least one heat sink associated with the heating elements.

19. Apparatus as claimed in claim 18, wherein the at least one heat sink comprises a body provided with a flow of a temperature-controlled fluid.

20. Apparatus as claimed in claim 18, wherein a heat sink is provided for each heating element.

21. Apparatus as claimed in claim 18, wherein a single heat sink is provided for the multiple heating elements.

22. Apparatus as claimed in claim 21, wherein the single heat sink is incorporated into the chuck.

23. Apparatus as claimed in claim 22, wherein the temperature of the chuck temperature is regulated by a temperature-controlled fluid.

24. A method of controlling the temperature of multiple integrated circuit devices during testing, comprising:
   (i) locating the integrated circuit devices at a test location at which multiple temperature control devices are arranged to correspond with the arrangement of the integrated circuit devices being tested;
   (ii) testing individual ones of the integrated circuit devices; and
   (iii) controlling the temperature of the individual devices being tested on the wafer using the corresponding temperature control device.

25. A method as claimed in claim 24, wherein the integrated circuit devices are located on a wafer.

26. A method as claimed in claim 24, wherein the integrated circuit devices are singulated before testing.

27. A method as claimed in claim 26, wherein the singulated devices are arranged on the chuck in the same arrangement as when they were formed on a wafer.

28. A method as claimed in claim 24, wherein locating the integrated circuit devices includes placing the devices on a chuck.

29. A method according to claim 28, wherein the chuck has multiple surfaces corresponding to each device being tested, the temperature of which is controlled to control the temperature of individual devices being tested.

30. A method of controlling the temperature of a plurality of integrated circuit devices during testing, comprising:
   placing the plurality of integrated circuit device in contact with a respective one of a plurality of regions of a surface of a heat exchanger; and
   controlling individually the temperature of each of the plurality of integrated circuit devices at each of the plurality of regions.

31. A method according to claim 30, wherein the heat exchanger comprises a chuck having a plurality of heating elements disposed of each of said regions.

32. A method according to claim 31, wherein the chuck includes a heat sink, and
   wherein the controlling includes regulating the temperature of a corresponding one of said regions with said heating elements at a temperature above a temperature determined by the heat sink.

33. A method according to claim 32, wherein the heat sink defines a cavity adapted to be provided with a flow of temperature-controlled fluid.

34. A method according to claim 30, further comprising:
   providing one of a plurality of heater elements at each of the plurality of regions.

35. A method according to claim 30, wherein the temperature of each region is individually controlled by a heating element disposed on a heat sink.

36. A method according to claim 35, further comprising:
   disposing said heating elements over a corresponding one of a plurality of heat sinks.

37. A method according to claim 35, further comprising:
   disposing said heating elements over a single heat sink.

38. A method according to claim 30, wherein the plurality of integrated circuit device are formed on a wafer and the surface is disposed to contact the wafer such that the plurality of regions correspond to respective ones of the plurality of integrated circuit devices formed on the wafer.

39. A method according to claim 30, wherein the plurality of integrated circuit devices are singulated devices, and the surface is disposed to contact the singulated devices such that the plurality of regions correspond to respective ones of the singulated devices.

40. A method according to claim 30, wherein the temperature of each of the plurality of integrated circuit devices is individually controlled based on the power usage of said integrated circuit devices.

\* \* \* \* \*